United States Patent
Kinoshita et al.

(10) Patent No.: US 9,893,260 B2
(45) Date of Patent: Feb. 13, 2018

(54) THERMOELECTRIC MATERIAL

(71) Applicants: TOYOTA JIDOSHA KABUSHIKI KAISHA, Toyota-shi, Aichi-ken (JP); NATIONAL INSTITUTE FOR MATERIALS SCIENCE, Tsukuba-shi, Ibaraki-ken (JP)

(72) Inventors: Yohei Kinoshita, Shizuoka (JP); Yuya Sakuraba, Tsukuba (JP); Taisuke Sasaki, Tsukuba (JP); Kazuhiro Hono, Tsukuba (JP)

(73) Assignees: TOYOTA JIDOSHA KABUSHIKI KAISHA, Toyota (JP); NATIONAL INSTITUTE FOR MATERIALS SCIENCE, Tsukuba-shi (JP)

( * ) Notice: Subject to any disclaimer, the term of this patent is extended or adjusted under 35 U.S.C. 154(b) by 173 days.

(21) Appl. No.: 14/947,422

(22) Filed: Nov. 20, 2015

(65) Prior Publication Data

US 2016/0155919 A1 Jun. 2, 2016

(30) Foreign Application Priority Data

Nov. 27, 2014 (JP) .................. 2014-240237

(51) Int. Cl.
*H01L 37/00* (2006.01)
*H01L 35/20* (2006.01)
*C22C 38/00* (2006.01)

(52) U.S. Cl.
CPC .............. *H01L 35/20* (2013.01); *C22C 38/00* (2013.01); *C22C 2202/00* (2013.01)

(58) Field of Classification Search
CPC ...... H01L 35/20; C22C 38/00; C22C 2202/00
See application file for complete search history.

(56) References Cited

U.S. PATENT DOCUMENTS

| | | | |
|---|---|---|---|
| 4,891,278 A * | 1/1990 | Otomo | G11B 5/127 428/681 |
| 2013/0154633 A1 | 6/2013 | Fujiwara et al. | |
| 2013/0177469 A1* | 7/2013 | Ruhlman | C22C 35/005 420/82 |

FOREIGN PATENT DOCUMENTS

| | | |
|---|---|---|
| JP | 2012-049403 A | 3/2012 |
| JP | 2014-072256 A | 4/2014 |

OTHER PUBLICATIONS

Miyasato, "Anomalous Hall Effect and Nernst-Ettingshausen Effect of Itinerant Ferromagnets," University of Tokyo Doctoral Dissertation, 2007.
Pu et al., "Mott Relation for Anomalous Hall and Nernst Effect in Ga1-xMnxAs Ferromagnetic Semiconductors," Physical Review Letters, Sep. 12, 2008, vol. 101, pp. 117208-1 thru 117208-4.

* cited by examiner

Primary Examiner — Carol M Koslow
(74) Attorney, Agent, or Firm — Oliff PLC

(57) ABSTRACT

Provided is a thermoelectric material which can increase its anomalous Nernst angle. The thermoelectric material of a magnetic material for a thermoelectric power generation device employs the anomalous Nernst effect, including iron doped with iridium.

1 Claim, 5 Drawing Sheets

THERMOELECTRIC MATERIAL

TECHNICAL FIELD

The present invention relates to a thermoelectric material for a thermoelectric power generation device employing the anomalous Nernst effect.

BACKGROUND

The anomalous Nernst effect, which develops on a ferromagnetic material, is a phenomenon that an electric field occurs in a direction perpendicular to heat flow and magnetization. The Seebeck effect, which has been conventionally researched as a thermoelectric power generation technique, is a phenomenon that heat flow and an electric field occur in a coaxial direction. Therefore, in converting heat energy from a heat source to electrical energy, a complex structure needs to be made in which p-type semiconductors and n-type semiconductors are alternatively connected in series to be arranged in a matrix shape.

On the other hand, by employing the anomalous Nernst effect for thermoelectric power generation, an electric field occurs in an in-plain direction to heat flow flowing outside the plane. Therefore, thermoelectric conversions can be done with a very easy structure of a magnetic wire extending in the in-plane direction of a heat source. Thus, with a thermoelectric power generation employing the anomalous Nernst effect, advantages such as an easy application to a heat source not having flatness, like a cylindrical heat source, and a cost reduction of devices can be obtained.

As a technique related to such a thermoelectric power generation device, for example JP 2014-72256 A discloses a thermoelectric power generation device arranged on a substrate, the device having a power generating material consisting of a ferromagnetic material magnetized in a predetermined direction, wherein the power generating material is structured so as to generate electric power with a temperature difference in a direction perpendicular to the direction of magnetization, by the anomalous Nernst effect. Paragraph 0019 of the description of JP 2014-72256 A describes that the power generating material preferably consists of an $L1_0$ ordered alloy having high magnetic anisotropy. In paragraph 0019, FePt, CoPt, FePd, CoPd, FeNi, MnAl, MgGa and the like are given as examples of the $L1_0$ ordered alloy having high magnetic anisotropy. MIYASATO Takuro, "Anomalous Hall effect and Nernst-Ettingshausen effect of Itinerant Ferromagnets", University of Tokyo Doctoral Dissertation, 2007 discloses Seebeck coefficients and Nernst coefficients of pure metals such as Fe, Co and Ni at various temperatures. Pu et al., Physical Review Letters, 2008, vol. 101, 117208 discloses $Ga_{1-x}Mn_xAs$ as a thermoelectric material. For example, it is possible to read from FIG. 3 in Pu et al. that the ferromagnetic property is lost and the anomalous Nernst effect does not develop at the room temperature.

SUMMARY

Technical Problem

In the past reports, the thermoelectric power $S_{ANE}$ (voltage to be generated in 1K of temperature difference) which shows the size of the voltage to be generated by the anomalous Nernst effect is approximately 1 to 2 µV at most. Therefore, it is necessary to improve the thermoelectric power, in order to practically use the thermoelectric power generation employing the anomalous Nernst effect. In order to improve the thermoelectric power, the anomalous Nernst angle $\theta_{ANE}$ (=Nernst coefficient/Seebeck coefficient) which shows the conversion ratio from the Seebeck current generated in a substance to the anomalous Nernst current needs to be made large. In a calculation based on the disclosure in MIYASATO, the anomalous Nernst angles of Fe, Co and Ni are approximately 2%, 1% and 0.4%, respectively. In a calculation based on the disclosure in Pu et al., the anomalous Nernst angle of $Ga_{1-x}Mn_xAs$ is up to 6 to 7% at a temperature around 110 K. As seen above, with the conventional techniques, the anomalous Nernst angle is small, therefore it is difficult to practically use the thermoelectric power generation employing the anomalous Nernst effect.

An object of the present invention is to provide a thermoelectric material which can increase the anomalous Nernst angle.

Solution to Problem

As a result of intensive researches, the inventors of the present invention found that it is possible to increase the anomalous Nernst angle by doping iron with iridium. According to the researches from the inventors, the anomalous Nernst angle can be increased up to 38% by adjusting the doping amount of iridium. The present invention has been made based on the above finding.

In order to solve the above problem, the present invention is directed to the following embodiments. That is, the present invention is a thermoelectric of a magnetic material for a thermoelectric power generation device employing the anomalous Nernst effect, the thermoelectric material including iron doped with iridium.

It is possible to increase the anomalous Nernst angle by doping iron with iridium. Therefore, by having such an embodiment, it is possible to provide a thermoelectric material which can increase the anomalous Nernst angle. By employing the thermoelectric material of the present invention for a thermoelectric power generation device employing the anomalous Nernst effect, it is possible to increase the conversion ratio from the Seebeck current generated in a substance to the anomalous Nernst current. Therefore, it is considered that it gets easy to practically use the thermoelectric power generation employing the anomalous Nernst effect.

In the present invention, it is preferable that the doping amount of the iridium is 7.9 at % or more. By making the doping amount of the iridium 7.9 at % or more, the anomalous Nernst angle gets easy to be increased.

Advantageous Effects of Invention

According to the present invention, it is possible to provide a thermoelectric material which can increase the anomalous Nernst angle.

DESCRIPTION OF EMBODIMENTS

Figure 1:
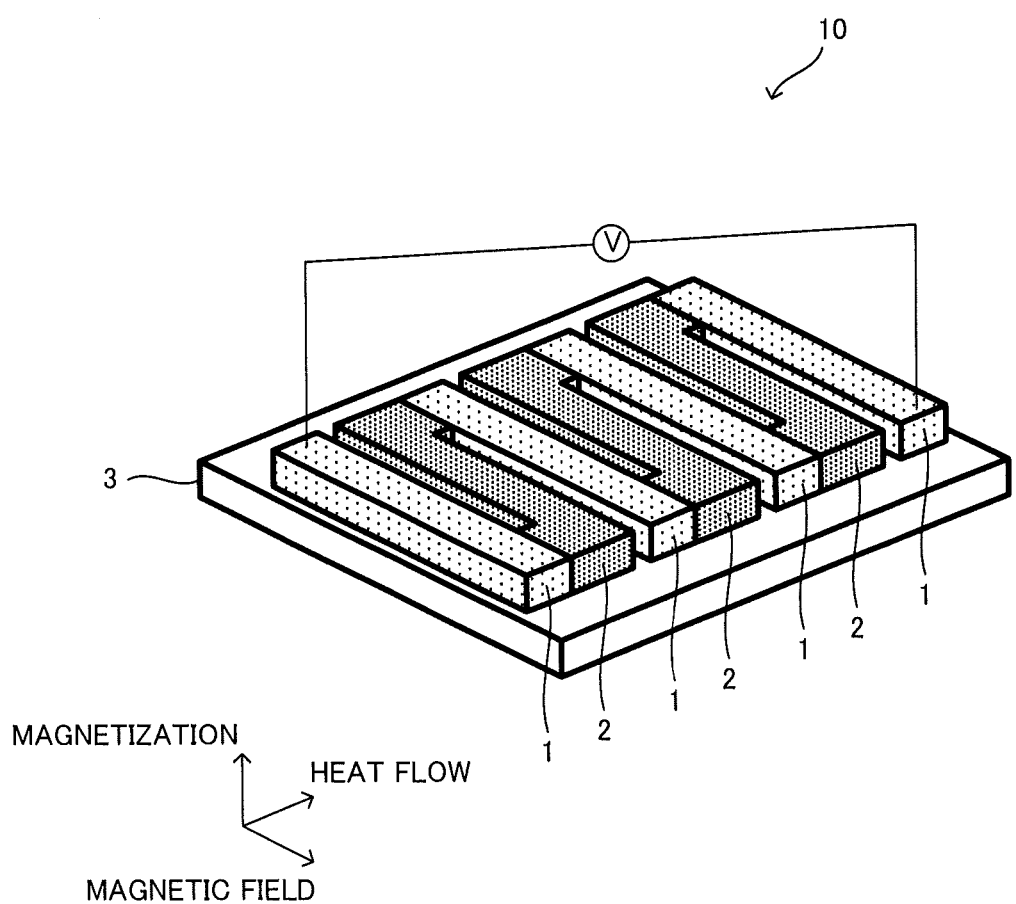
FIG. 1 is a view to explain a thermoelectric power generation device 10 employing a thermoelectric material 1 of the present invention.

Hereinafter the present invention will be explained referring to the drawings. The embodiments shown below are examples of the present invention, and the present invention is not limited to the embodiments.

FIG. 1 is a view to explain a thermoelectric power generation device 10 employing a thermoelectric material of the present invention. The thermoelectric device 10 shown in FIG. 1 includes a substrate 3, a thermoelectric material 1 and a connector 2 that are arranged on the substrate 3.

The thermoelectric material 1 is formed of iron (Fe) doped with iridium (Ir). The connector 2 is formed of: a nonmagnetic material not showing anomalous Nernst effect (e.g. copper (Cu) and chromium (Cr)); or a ferromagnetic material having a magnetization opposite to that of the thermoelectric material 1; or a ferromagnetic material having anomalous Nernst coefficient opposite to that of the thermoelectric material 1 (e.g. MnGa). The substrate 3 is formed of silicon, magnesium, and the like.

The thermoelectric material 1 is formed of a line-thinned thin film of Fe doped with Ir formed on the substrate 3. The thermoelectric material 1 is magnetized in the direction shown in FIG. 1. The thermoelectric material 1 is configured so as to generate power in the direction of the electric field shown in FIG. 1, against the temperature difference in the direction (direction of heat flow shown in FIG. 1) perpendicular to the direction of magnetization, by the anomalous Nernst effect.

The connector 2 is arranged on the surface of the substrate 3, parallel to each of thermoelectric bodies 1, 1, . . . . One connector 2 is arranged between one pair of the thermoelectric bodies 1, 1 adjacent to each other. The connector 2 electrically connects one end side of one of the pair of the thermoelectric bodies 1, 1, and the other end side of the other one of the pair of the thermoelectric bodies 1, 1. This makes the thermoelectric bodies 1, 1, . . . electrically connected in series by the connector 2.

As described above, the thermoelectric power generation device 10 includes the thermoelectric material 1 formed of Fe doped with Ir. The thermoelectric material 1 formed of Fe doped with Ir can increase its anomalous Nernst angle more than a conventional magnetic material. Therefore, according to the present invention, it is possible to provide the thermoelectric material 1 which can increase the anomalous Nernst angle. By using such a thermoelectric material 1, it is possible to provide the thermoelectric power generation device 10 having a configuration easy to be practically used.

In the present invention, the doping amount of Ir in the thermoelectric material 1 can be adequately determined, depending on the size of a necessary anomalous Nernst angle. As described later, by doping Fe with Ir, it is possible to enlarge the size of anomalous Nernst angle compared to the case where Fe is not doped with Ir. Therefore, the doping amount of Ir in the present invention is more than 0 at %, On the other hand, the inventors of the present invention have found the followings: (1) it is possible to increase the anomalous Nernst angle by increasing the doping amount of Ir. For example, it is possible to increase the anomalous Nernst angle more than the material described in Pu et al., by making the doping amount of Ir 7.9 at % or more; and (2) if the doping amount of Ir is excessively increased, the anomalous Nernst angle tends to decrease. According to researches of the inventors of the present invention, it is considered that the doping amount of Ir with which the anomalous Nernst angle starts to decrease is between 18 at % and 22 at %. Therefore, the upper value of the doping amount of Ir is preferably between 18 at % and 22 at %.

EXAMPLES

It has been suggested that anisotropic scatterings by impurities having large spin orbit interactions to the spin direction of electrons originate effectively the anomalous Nernst effect, though details are unknown. Therefore, whether the anomalous Nernst effect was increased or not was confirmed by doping Fe which is a magnetic material, with heavy elements such as Ir, Ta and Bi, to generate scatterings of electron spins.

1. Sample Production

Example

Figure 2:
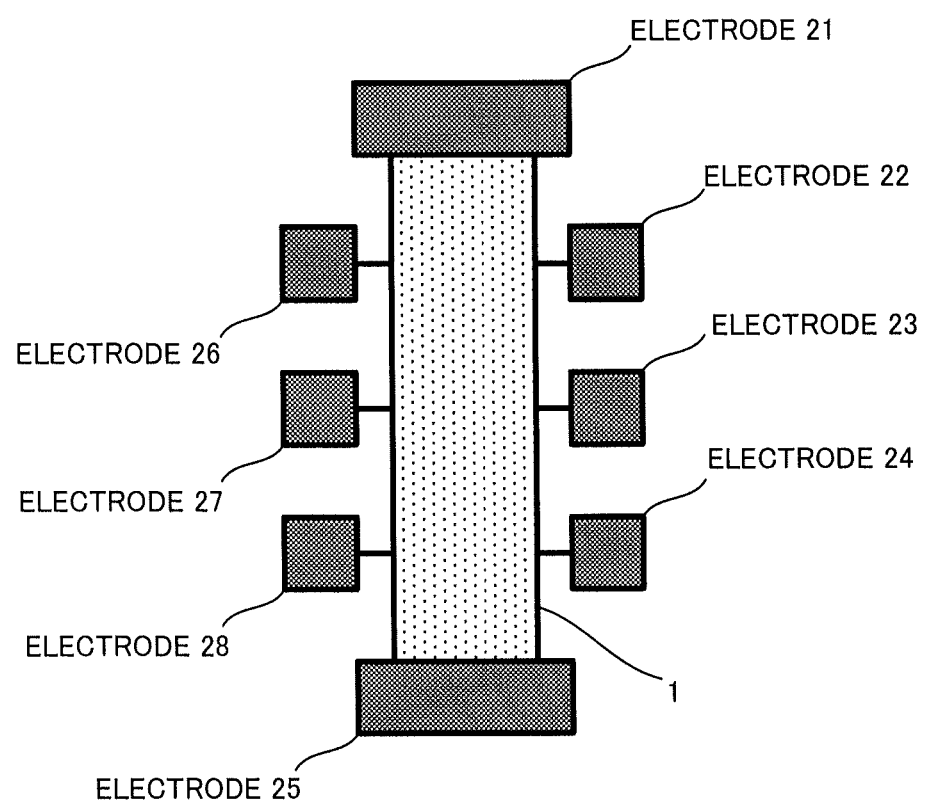
FIG. 2 is a view to explain an embodiment of a thermoelectric power generation device of Example.

A thin film formed of Fe doped with Ir was produced on a substrate of magnesium oxide and silicon single crystal, via a process of simultaneously discharging Fe target and Ir target by means of a magnetron sputtering apparatus (BC6155, manufactured by ULVAC, INC.). Thereafter, a thermoelectric material attached with a thin wire of Fe doped with Ir and an Au electrode for measurement was formed by means of photolithography. The doping amount of Ir was adjusted by a simultaneous film deposition method for Fe target and Ir target. In producing a thermoelectric material whose doping amount of Ir was zero, only Fe target was discharged in producing a thin film. The configuration of a thermoelectric power generation device of Example produced as described is shown in FIG. 2.

Comparative Example 1

A thermoelectric power generation device of Comparative Example 1 was produced in the same manner as in producing the thermoelectric power generation device of Example, except that Ta target was used instead of Ir target in producing a thin film.

Comparative Example 2

A thermoelectric power generation device of Comparative Example 2 was produced in the same manner as in producing the thermoelectric power generation device of Example, except that Bi target was used instead of Ir target in producing a thin film.

2. Measurement of Seebeck Coefficient

Each of the produced thermoelectric devices of Example, Comparative Example 1, and Comparative Example 2 was installed in a two-terminal prober apparatus. A heat gradient ∇T was applied in the in-plain direction of the thin film by a heater arranged on an electrode 21 side shown in FIG. 2. Terminal probes were put on an electrode 22 and an electrode 24, and Seebeck electromotive force $V_{SE}$ was measured by means of a nanovoltmeter. The Seebeck coefficient was measured by measuring the heat gradient dependency of ∇T dependency of $V_{SE}$, changing the power of the heater.

Figure 3A:
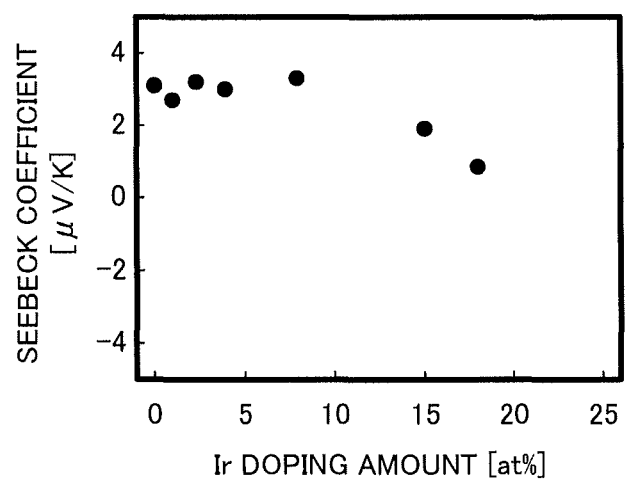
FIG. 3A is a graph to explain the relationship between the Seebeck coefficient and the doping amount of Ir in the thermoelectric power generation device of Example.

Table 1 shows the results of the Seebeck coefficient of the thermoelectric device of Example. Table 2 shows the results of the Seebeck coefficient of the thermoelectric device of Comparative Example 1. Table 3 shows the results of the Seebeck coefficient of the thermoelectric device of Comparative Example 2. FIG. 3A shows the relationship between the Seebeck coefficient and the doping amount of Ir in the thermoelectric device of Example.

3. Measurement of Nernst Coefficient

Figure 3B:
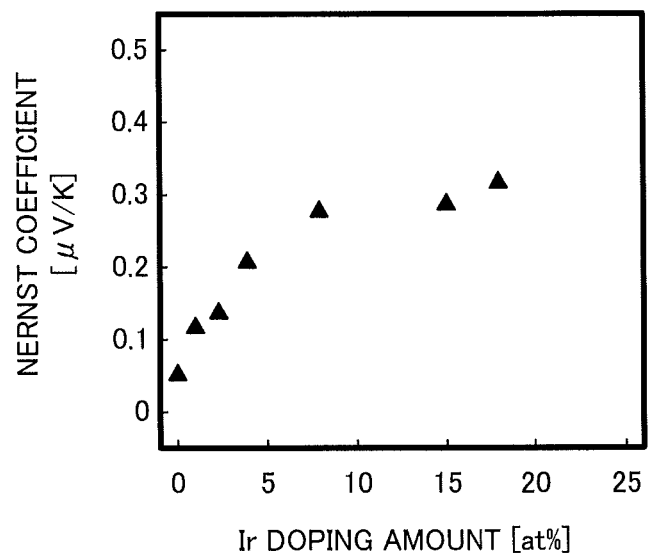
FIG. 3B is a view to explain the relationship between the Nernst coefficient and the doping amount of Ir in the thermoelectric power generation device of Example.

Each of the produced thermoelectric devices of Example, Comparative Example 1, and Comparative Example 2 was installed in a two-terminal prober apparatus. A heat gradient ∇T was applied in the in-plain direction of the thin film by a heater arranged on the electrode 21 side shown in FIG. 2. Terminal probes were put on an electrode 23 and an electrode 27. A magnetic field was applied in the direction perpendicular to the surface of the thin film by an electromagnet, and the anomalous Nernst voltage $V_{ANE}$ generated when Fe was magnetized in the direction perpendicular to the surface was measured by means of a nanovoltmeter. The anomalous Nernst coefficient (Nernst coefficient) was measured by measuring the heat gradient dependency of ∇T dependency of $V_{ANE}$, changing the power of the heater. Table 1 shows the results of the Nernst effect of the thermoelectric device of Example. Table 2 shows the results of the Nernst effect of the thermoelectric device of Comparative Example 1. Table 3 shows the results of the Nernst effect of the thermoelectric device of Comparative Example 2. FIG. 3B shows the relationship between the Nernst coefficient and the doping amount of Ir in the thermoelectric device of Example. In Table 3, "-" means that the value of the Nernst coefficient could not be identified since the Seebeck coefficient was small, or that the value of the anomalous Nernst angle could not be identified since the value of the Nernst coefficient could not be identified.

4. Identification of Anomalous Nernst Angle

Figure 3C:
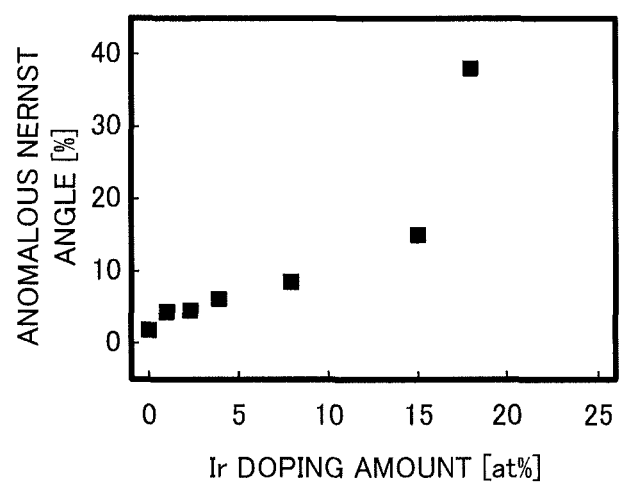
FIG. 3C is a view to explain the relationship between the anomalous Nernst angle and the doping amount of Ir in the thermoelectric power generation device of Example.

Seebeck coefficients measured in the above 2, and Nernst coefficients measured in the above 3. were substituted in "anomalous Nernst angle (%)=100*Nernst coefficient/Seebeck coefficient", whereby the anomalous Nernst angle (%) was derived. Table 1 shows the results of the anomalous Nernst angle of the thermoelectric device of Example. Table 2 shows the results of the anomalous Nernst angle of the thermoelectric device of Comparative Example 1. Table 3 shows the results of the anomalous Nernst angle of the thermoelectric device of Comparative Example 2. FIG. 3C shows the relationship between the anomalous Nernst angle and the doping amount of Ir in the thermoelectric device of Example.

TABLE 1

| Ir doping amount [at %] | Seebeck coefficient [μV/K] | Nernst coefficient [μV/K] | anomalous Nernst corner [%] |
|---|---|---|---|
| 0 | 3.1 | 0.055 | 1.8 |
| 1.0 | 2.7 | 0.12 | 4.3 |
| 2.3 | 3.2 | 0.14 | 4.5 |
| 3.9 | 3.0 | 0.21 | 6.1 |
| 7.9 | 3.3 | 0.28 | 8.5 |
| 15 | 1.9 | 0.29 | 15 |
| 18 | 0.84 | 0.32 | 38 |

TABLE 2

| Ta doping amount [at %] | Seebeck coefficient [μV/K] | Nernst coefficient [μV/K] | anomalous Nernst corner [%] |
|---|---|---|---|
| 0 | 3.1 | 0.055 | 1.8 |
| 0.74 | 3.3 | 0.070 | 2.1 |
| 2.5 | 3.6 | 0.052 | 1.4 |
| 3.6 | 3.6 | 0.051 | 1.4 |
| 6.3 | 6.3 | 0.077 | 1.2 |
| 11 | 6.4 | 0.070 | 1.1 |

TABLE 3

| Bi doping amount [at %] | Seebeck coefficient [μV/K] | Nernst coefficient [μV/K] | anomalous Nernst corner [%] |
|---|---|---|---|
| 0 | 3.1 | 0.055 | 1.8 |
| 1.7 | 1.6 | — | — |
| 2.6 | 0.96 | — | — |
| 4.3 | 0.18 | — | — |

5. Results

As shown in Table 1 and FIG. 3A, the Seebeck coefficient decreased as the doping amount of Ir increased. In contrast, as shown in Table 1 and FIG. 3B, the Nernst coefficient increased as the doping amount of Ir increased. As a result, as shown in Table 1 and FIG. 3C, a tendency of the anomalous Nernst angle to increase as the doping amount of Ir increases appeared. From the above results, it was possible to considerably increase the anomalous Nernst angle by doping Fe with Ir. With a Fe sample including 18 at % of Ir, it was possible to obtain up to 38% of the anomalous Nernst angle.

As shown in Table 1 and FIG. 3C, the anomalous Nernst angle in a case where the doping amount of Ir was zero (pure Fe) was slightly less than 2%. Therefore, the conversion efficiency from the Seebeck current to the anomalous Nernst current was able to improve by approximately one digit by doping Fe with Ir. The finding that it is possible to convert 30% or more of the Seebeck current to the anomalous Nernst current by doping Fe with Ir is useful and novel for the practical use of a thermoelectric power generation employing the anomalous Nernst effect.

In contrast, as shown in Table 2, the Seebeck coefficient increased as the doping amount of Ta increased, whereas the anomalous Nernst angle was 2.1% at most. As shown in Table 3, the Seebeck coefficient decreased to be rarely observed as the doping amount of Bi increased. As a result, the observation of the Nernst coefficient got difficult and the anomalous Nernst angle could not be calculated.

REFERENCES SIGN LIST 1 thermoelectric material
2 connector
3 substrate
10 thermoelectric power generation device
21, 22, 23, 24, 25, 26, 27, 28 electrode

The invention claimed is:
1. A thermoelectric material comprising iron doped with iridium, wherein a doping amount of the iridium in the thermoelectric material is 15 at % or more and 22 at % or less.

* * * * *